United States Patent

(12) United States Patent
Parker

(10) Patent No.: US 6,243,853 B1
(45) Date of Patent: Jun. 5, 2001

(54) DEVELOPMENT OF AUTOMATED DIGITAL LIBRARIES FOR IN-CIRCUIT TESTING OF PRINTED CURCUIT BOARDS

(75) Inventor: Kenneth P. Parker, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/165,538

(22) Filed: Oct. 2, 1998

(51) Int. Cl.[7] ...................................................... G06F 17/50
(52) U.S. Cl. .................................................... 716/18; 716/4
(58) Field of Search ............................. 716/1, 4, 11, 18; 714/734; 707/102, 103, 104

(56) References Cited

U.S. PATENT DOCUMENTS

| | | | | |
|---|---|---|---|---|
| 5,127,009 | * | 6/1992 | Swanson | 371/22.6 |
| 5,323,108 | * | 6/1994 | Marker, III et al. | 324/158 R |
| 5,539,652 | * | 7/1996 | Tegethoff | 364/490 |
| 5,590,136 | * | 12/1996 | Firooz | 371/25.1 |

OTHER PUBLICATIONS

Nummela et al., "Strategies for Implementation Independent DSP System Development Using HDL Based Design Automation," Proc. 5th Annual IEEE Int'l ASIC Conference & Exhibit, pp. 214–218, 1992.*

Nousiainen et al., "Strategies for Development & Modeling of VHDL Based Macrocell Library," Proc. 4th European Conference on Design Automation, pp. 478–482, 1993.*

Ogawa et al., "Pastel: A Parameterized Memory Characterization System," Proc. of Design, Automation and Test in Europe, pp. 15–20, 1998.*

Perelló et al., "An Automated Approach on Electrical Technology Characterization and Analysis," IEEE Trans on Semiconductor Manufacturing, vol. 9, No. 4, pp. 573–577, 1996.*

Wohl et al., "Extracting Gate–Level Networks from Simulation Tables," Int'l Test Conference, pp. 622–631, 1998.*

* cited by examiner

*Primary Examiner*—Matthew Smith
*Assistant Examiner*—Leigh Marie Garbowski

(57) ABSTRACT

An apparatus and method for developing digital libraries that are used in creating executable tests for testing devices at the board level. The present invention is called automated digital library development. An automated digital library is a library of pre-defined information and tests for a device that is automatically extracted during device synthesis. Automated digital library development, therefore, is the recordation of predefined device information during device synthesis, which information is made available for in-circuit test application at the board level. Since device information and tests are predefined in a digital library, automated digital library development can automate the process of creating the digital library, thereby reducing the time and expense of manually creating it. As a result, more device information and tests can be generated. Additionally, since the information is recorded at the time the device is synthesized, the accuracy and reliability of the information is maximized. Automated digital library development, therefore, can provide comprehensive, accurate, and high quality information and tests for in-circuit test application at the board level.

21 Claims, 18 Drawing Sheets

| | | |
|---|---|---|
| 500 | sequential | |
| 502 | family CMOS | |
| 504 | assign A20M to pins "D15"<br>assign ABUS2 to pins "Q14"<br>assign ABUS3 to pins "R15" . . . | |
| 506 | power VCC_1, VCC_2, GND_1, ...<br>inputs A20M, AHOLD, BOFF, ...<br>outputs FERR, HLDA, LOCK, ...<br>bidirectional ABUS1, ABUS2, ...<br>nondigital NC1, NC2, VREFOUT, ... | |
| 508 | vector cycle 500n<br>receive delay 400n | |
| 510 | pcf order default Parallel is TCK, TMS<br>pcf order default Parallel is TDI, TDO<br>pcf order default Parallel is A20M, AHOLD<br>pcf order default Parallel is BOFF, ...<br>pcf order Scan is TCK, TMS, TDI, TDO | |
| 512 | unit disable method "BScan Based Disable"<br>  disable TDO with TCK, TMS .<br>    disable TDO with TMS hold "0" b<br>    disable ABUS2, ABUS3, ABUS4<br>    disable ABUS5, ABUS6, ABUS7 . . .<br>  pcf<br>  use pcf order Parallel<br>  "01ZXZZZZZZZ...."<br>  use pcf order Scan<br>  "11ZX"<br>  "01ZX"<br>  end pcf<br>end unit | (a)<br>(b)<br>(c)<br>(d)<br>(e)<br>(f)<br>(g)<br>(h)<br>(i)<br>(j)<br>(k)<br>(l) |
| 514 | unit "Test Unit"<br>  pcf<br>    use pcf order Parallel<br>    "01XZZ01ZZZZXXXXHLXXX"<br>    "01XZZ10ZZZZXXXXLHXXX"<br>  end pcf<br>end unit | (a)<br>(b)<br>(c)<br>(d)<br>(e)<br>(f) |

FIGURE 5

700 — combinational

702 — family TTL

704
```
assign Vcc to pins 1
assign A1 to pins 2
assign A2 to pins 3
assign En to pins 4
assign B1 to pins 5
assign B2 to pins 6
assign Gnd to pins 7
```

706
```
power Gnd, Vcc
inputs A1, A2, En
outputs B1, B2
```

708
```
vector cycle 250n
receive delay 150n
```

710 — pcf order default All is A1, A2, En, B1, B2

712 — disable B1, B2 with En to "0"

714
```
unit "Test 1"
! Test nodes A1, En, B1
pcf
use pcf order All
"0Z1LX"
"1Z1HX"
end pcf
end unit ! "Test 1"
```

716
```
unit "Test 2"
! Test nodes A2, En, B2
pcf
use pcf order All
"Z01XL"
"Z11XH"
end pcf
end unit ! "Test 1"
```

FIGURE 7

900 | sequential

902 | family TTL

904 | assign Vcc to pins 1
assign A1 to pins 2
assign A2 to pins 3
assign En to pins 4
assign B1 to pins 5
assign B2 to pins 6
assign Gnd to pins 7
assign Ck to pins 8

906 | power Gnd, Vcc
inputs A1, A2, En, Ck
outputs B1, B2

908 | vector cycle 250n
receive delay 150n

910 | pcf order default All is A1, A2, En, Ck
pcf order default All is B1, B2

912 | unit disable method "Disable 1"
disable B1, B2 with En
disable B1, B2 with Ck hold "0"
pcf
use pcf order All
"ZZ00XX"    (a)
"ZZ01XX"    (b)
"ZZ00XX"    (c)
end pcf
end unit ! "Disable 1"

914 | unit "Test 1"
! Test nodes A1, Ck, En, B1
pcf
use pcf order All
"ZZ10XX"
"0Z11LX"
"1Z01HX"
end pcf
end unit ! "Test 1"

916 | unit "Test 2"
! Test nodes A2, Ck, En, B2
pcf
use pcf order All
"ZZ10XX"
"Z011XL"
"Z101XH"
end pcf
end unit ! "Test 1"

FIGURE 9

| | |
|---|---|
| 1100 | Sequential |
| 1102 | family CMOS |
| 1104 | assign Scan_En to pins 1<br>assign Scan_CK to pins 2<br>assign Scan_In to pins 3<br>assign P4 to pins 4<br>assign P5 to pins 5<br>assign P6 to pins 6<br>assign P7 to pins 7<br>assign P8 to pins 8<br>assign P9 to pins 9<br>assign P10 to pins 10<br>assign Vcc to pins 11<br>assign Gnd to pins 12<br>assign P13 to pins 13<br>assign P14 to pins 14<br>assign Scan_Out to pins 15 | |
| 1106 | power Gnd, Vcc<br>inputs Scan_En, Scan_Ck, Scan_In, P4, P5<br>inputs P6, P7, P8, P9, P10<br>outputs P13, P14, Scan_Out |
| 1108 | vector cycle 250n<br>receive delay 150n |
| 1110 | pcf order All is Scan_CK, Scan_In                  (a)<br>pcf order All is Scan_In, Scan_Out<br>pcf order All is P4, P5, P6, P7, P8<br>pcf order All is P9, P10, P13, P14<br>pcf order default Scan is Scan_Ck, Scan_En    (b)<br>pcf order default Scan is Scan_In, Scan_Out |
| 1112 | unit disable method "Disable 1"<br>disable P14 with Scan_En<br>disable P14 with Scan_Ck hold "0"              (a)<br>pcf<br>use pcf order All<br>"010XZZZZZZZZXX"                                   (b)<br>use pcf order Scan<br>"110X"    ! SRC 0 = 0                              (c)<br>end pcf<br>repeat 7 ! Loop contains vectors 3-16            (d)<br>pcf<br>"01ZX"    ! SRCs 1-7<br>"11ZX"<br>end pcf<br>end repeat ! Next will be vector 17<br>pcf<br>"00ZX"                                             (e)<br>end pcf<br>end unit ! "Disable 1" |

```
unit "Test Outputs 01"
! Test pins P13, P14
pcf
use pcf order All
"011XZZZZZZZXX"                    (a)
use pcf order Scan                 (b)
"111X"    ! SRC 0 = 1
"01ZX"
"11ZX"    ! SRC 1 = don't care
"010X"
"110X"    ! SRC 2 = 0
"010X"
"110X"    ! SRC 3 = 0
end pcf
repeat 4 ! Loop contains vectors 9-16   (c)
pcf
"01ZX"    ! SRCs 4-7
"11ZX"
end pcf
end repeat ! Next will be vector 17
pcf
use pcf order All
"01ZXZZZZZZZLH"
end pcf
end unit ! "Test Outputs 01"       (d)
```

1116

```
unit "Test Outputs 10"
! Test pins P13, P14
pcf
use pcf order All
"011X1ZZZZZZXX"                    (a)
use pcf order Scan                 (b)
"111X"    ! SRC 0 = 1
"011X"
"111X"    ! SRC 1 = 1
"011X"
"111X"    ! SRC 2 = 1
"010X"
"110X"    ! SRC 3 = 0
end pcf
repeat 4 ! Loop contains vectors 9-16   (c)
pcf
"01ZX"    ! SRCs 4-7
"11ZX"
end pcf
end repeat ! Next will be vector 17
pcf
use pcf order All
"01ZX1ZZZZZZHL"                    (d)
end pcf
end unit ! "Test Outputs 10"       (e)
```

```
unit "Test Input P4"
! Test pin P4; requires P14, SRCs 0-2
pcf
use pcf order All
"011XZZZZZZZXX"                    (a)
use pcf order Scan                 (b)
"111X"    ! SRC 0 = 1
"011X"
"111X"    ! SRC 1 = 1
"011X"
"111X"    ! SRC 2 = 1
end pcf
repeat 5 ! Loop contains vectors 7-16   (c)
pcf
"01ZX"    ! SRCs 3-7
"11ZX"
end pcf
end repeat ! Next will be vector 17
pcf
use pcf order All
"01ZX0ZZZZZZXH"                    (d)
"01ZX1ZZZZZZXL"                    (e)
end pcf
end unit ! "Test Input P4"
```

*FIGURE 11(c)*

```
1120   unit "Test Input P5"
       ! Test pin P5; requires P6 and P7,
       !            SRC 7
       pcf
       use pcf order All
       "00ZXZ000ZZZXX"                          (a)
       "10ZXZ000ZZZXX"                          (b)
       end pcf
       repeat 7 ! Loop contains vectors 3-16    (c)
       pcf
       "01ZX"   ! SRCs 0-6                      (d)
       "11ZX"
       end pcf
       end repeat ! Next will be vector 17
       pcf
       "01ZX"
       "11ZH"                                   (e)
       use pcf order ALL
       "00ZXZ100ZZZXX"                          (f)
       "10ZXZ100ZZZXX"
       end pcf
       repeat 7 ! Loop contains vectors 21-34   (g)
       pcf
       "01ZX"   ! SRCs 0-6                      (h)
       "11ZX"
       end pcf
       end repeat ! Next will be vector 35
       pcf
       "01ZX"
       "11ZL"                                   (i)
       end pcf
       end unit ! "Test Input

DEVELOPMENT OF AUTOMATED DIGITAL LIBRARIES FOR IN-CIRCUIT TESTING OF PRINTED CURCUIT BOARDS

FIELD OF THE INVENTION

This invention relates to the field of in-circuit testing of printed circuit boards, and more particularly to a method and an apparatus for developing digital libraries used in creating executable tests for testing devices at the board level.

BACKGROUND OF THE INVENTION

In-circuit testing of printed circuit boards is a technology at least 25 years old. In-circuit tests look for manufacturing faults, as opposed to defects of the integrated circuits, that may occur during the assembly of the board. The in-circuit test presumes that the integrated circuits, or devices, are good as a result of earlier device testing and focuses on the quality of the manufacturing process by testing each device to ensure that it is placed and soldered correctly. As a by-product of this testing, the device logic is tested by checking input/output receivers and drivers for possible damage that may have occurred while the devices and board were handled during the manufacturing process.

In the simplest case of testing devices, a standalone device is tested by surrounding it with probes and applying digital inputs in order to observe digital outputs. If two or more devices are attached together, the in-circuit test will require probe contact with each node (i.e., where two or more pins converge). Each device is tested by stimulating all inputs and causing all outputs to change at least once. The goal is that if there is a failure at any input, that failure will propagate through the device so that an output will eventually respond incorrectly. The data used to test an individual device is referred to as predefined tests which can be used by an in-circuit tester.

Pre-defined tests are often not comprehensive enough to account for the different topological constraints that might occur on a complex circuit board. For example, where two devices are being tested and the output on a first device shares the same node as an input on a second device, testing the second device would entail overdriving competing outputs from the first, or upstream, device. While in-circuit testers have sufficient overdrive capability to win when establishing input states, it is possible for the upstream device to suffer damage due to this overdrive on its outputs. If this is a concern, the Pre-defined test may need to be augmented to condition the outputs of the upstream device such that damage is avoided. Similarly, a pre-defined test may need to be augmented where two devices have one of their output pins tied together so that if the first device is tested, the output on its pin may not be readable if the second device's output pin is enabled. As another example, a device can have an input tied directly to a fixed voltage such that the pin cannot be stimulated with data. This could rule out a pre-defined test for this device that was created with the assumption that the pin was free to move. A tied pin constraint can also occur where a device has two input pins tied to the same node. If a pre-defined test for such a device required different states to be applied to the pins at any one time, then the constraint would not allow the test to be applied.

In-circuit testers have dealt with these problems for many years. One solution has been to include an in-circuit program generator (hereinafter referred to as an IPG) in the test system that analyzes board interconnect topology and then attempts to build executable tests from an externally supplied digital library of pre-defined information and tests. These libraries are called digital libraries, and are manually created by engineers. The tests can either be written at the board level such that they are tailored to the device configuration on the board, or the tests can be written without knowledge of board configuration such that they anticipate different configurations of the board. This process of manually creating tests, however, is time-consuming, resource-consuming, and very expensive. Talented engineers may spend weeks analyzing a device, writing the tests, and then verifying them. As a result, the tests are often incomplete or of marginal quality. For example, disable methods for a device may be missing for some outputs, or the device may only have a presence and orientation test available. Additionally, if the tests are written at the board level, they are often written for a device configuration that is subsequently modified. As a result, the tests become outdated and need to be redesigned. Another solution is to use a library creation service provider to create digital library tests. However, these providers often only accept orders for widely used devices so that they can spread the cost over many users. As a result, service providers cannot handle the increasingly growing number of custom, one-of-a-kind devices.

While digital library tests can provide an IPG with the information necessary to create executable tests that consider the topological constraints of the board, they are time and labor intensive, expensive, and have the potential to be outdated very quickly. As a result, there is a need for a method and an apparatus of developing digital libraries to:
- reduce the time and expense of creating device tests;
- maximize the amount of information and tests that can be provided about a device;
- increase the accuracy and reliability of device information; and
- increase the probability that useful tests survive board level constraints.

SUMMARY OF THE INVENTION

The present invention addresses this need through automated digital library development. An automated digital library is a library of pre-defined information and tests for a device that is automatically extracted during device synthesis. Automated digital library development, therefore, is the recordation of predefined device information during device synthesis, which information is made available for in-circuit test application at the board level. Since device information and tests are predefined in a digital library, automated digital library development can automate the process of creating the digital library, thereby reducing the time and expense of manually creating it. As a result, more device information and tests can be generated. Additionally, since the information is recorded at the time the device is synthesized, the accuracy and reliability of the information is maximized. Automated digital library development, therefore, can provide comprehensive, accurate, and high quality information and tests for in-circuit test application at the board level.

Device information can include device pin, pin family, disable, and conditioning information. Device tests can include truth-table vectors for presence and orientation, pin wiggle, and logic verification tests. In automated digital library development, a basic, minimum library should comprise device pin information and pin family information. A more fully developed library can comprise pin disable and pin conditioning methods, as well as device tests. A complete, high quality automated digital library may include a presence and orientation test, pin wiggle test, and logic verification test.

In a preferred embodiment of the invention, an automated digital library is generated and made available for each device on a printed circuit board, and each digital library is used by a Hewlett-Packard HP-3070® in-circuit tester where an IPG analyzes board interconnect topology and then attempts to build executable tests for each device on the board from an automated digital library of information and tests.

These and other important advantages and objectives of the present invention will be further explained in, or will become apparent from, the accompanying description, drawings, and claims.

BRIEF DESCRIPTION OF THE DRAWINGS

An illustrative and presently preferred embodiment of the invention is illustrated in the drawings, in which:

FIG. 3(a) illustrates the constraint of overdriving a competing output to stimulate an input; FIG. 3(b) illustrates the constraint of two competing outputs; FIG. 3(c) illustrates the constraint of an input pin tied to a fixed voltage; FIG. 3(d) illustrates the constraint of two input pins tied together.

FIG. 5 illustrates a sample fully featured library test.

FIG. 7 illustrates a sample library test for the combinational device of FIG. 6.

FIG. 9 illustrates a sample library test for the sequential device of FIG. 8.

DETAILED DESCRIPTION OF THE INVENTION

Figure 1:
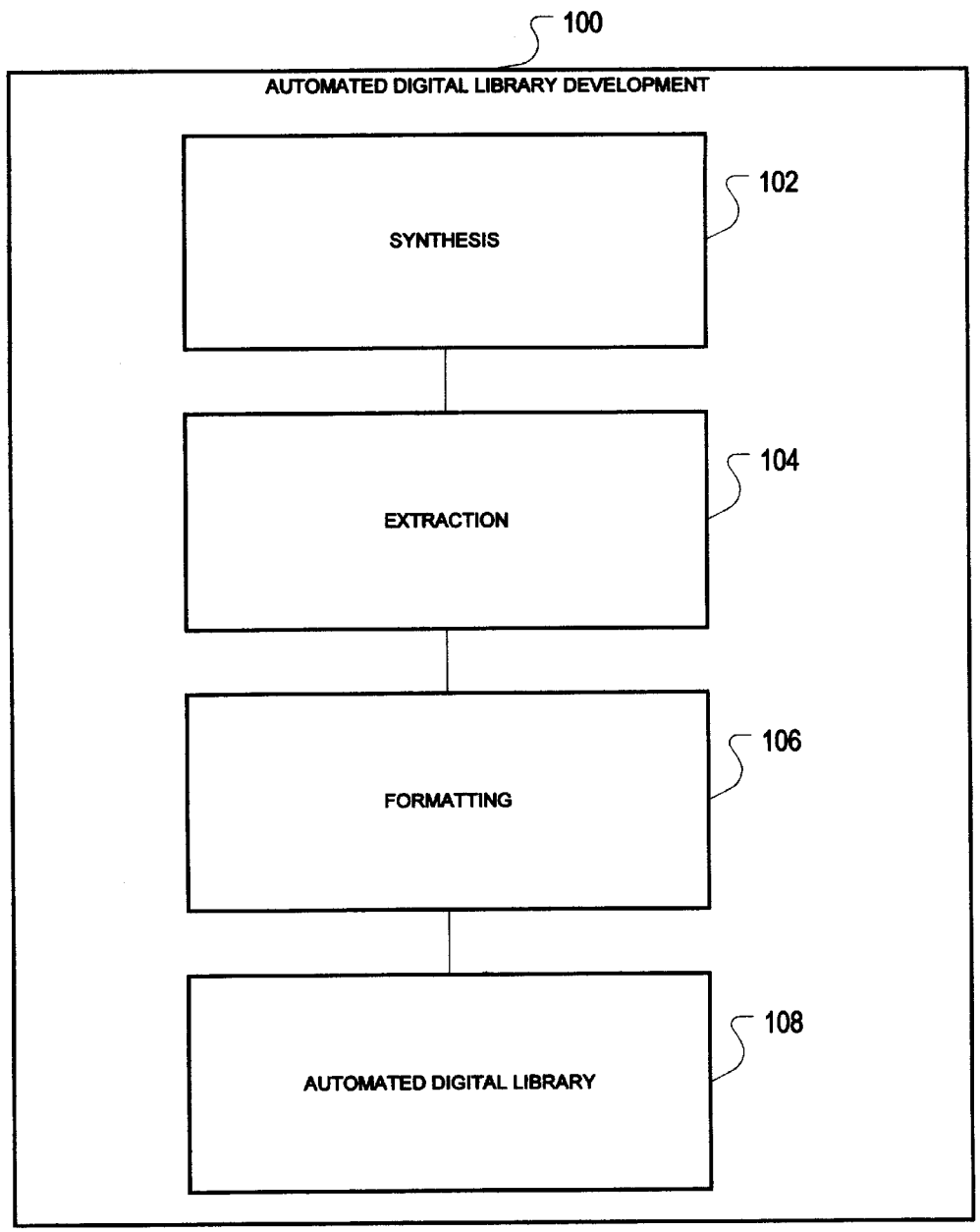
FIG. 1 illustrates components of automated digital library development.

Automated digital library development is an apparatus for generating an automated digital library for in-circuit testing at the board level comprising: one or more computer readable storage mediums; computer readable program code stored in the one or more computer readable storage mediums, where the computer readable code comprises program code for accessing a database of device and component descriptions 416 (FIG. 4) and synthesizing 102 (FIG. 1) a device which performs in conformance with a device design 400; and program code for accessing the database and extracting 104 device and component descriptions for generating an automated digital library for in-circuit test of the synthesized device 406 at the board level.

Figure 2:
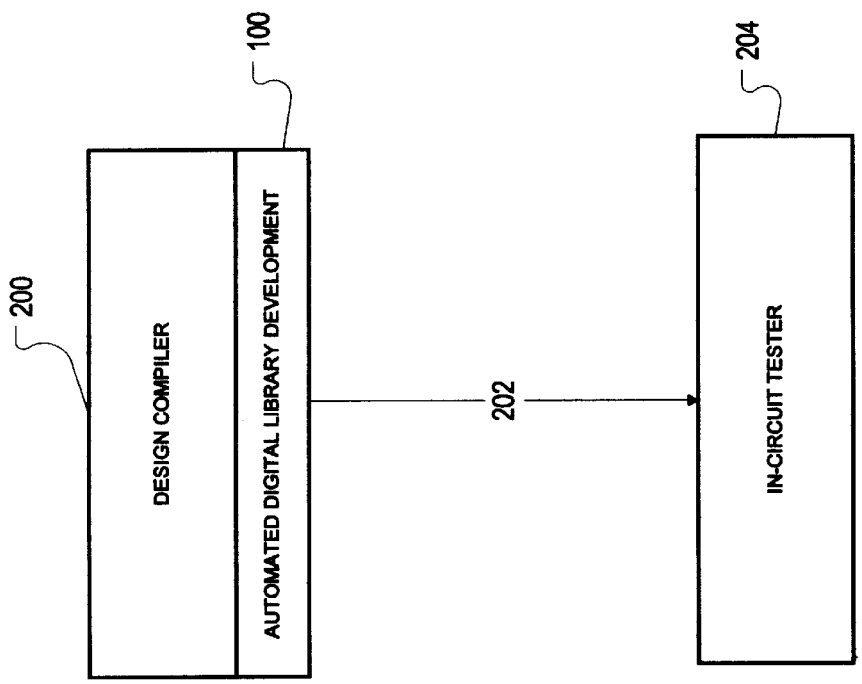
FIG. 2 illustrates automated digital library development during a device synthesis process.

As illustrated in FIG. 1, automated digital library development 100 comprises synthesizing 102 device logic and extracting 104 circuit and component descriptions for generating an automated digital library 108 as a device is synthesized. If the automated digital library that is generated is not written in the appropriate syntax, automated digital library development can also comprise formatting 106 the library. FIG. 2 illustrates an automated digital library development process wherein automated digital library development 100 is embedded in a design compiler 200. The end result is an automated digital library that is used 202 by an in-circuit tester 204. In a preferred embodiment, Hewlett Packard's 3070® in-circuit tester is used to implement in-circuit testing of a device.

Figure 3A:
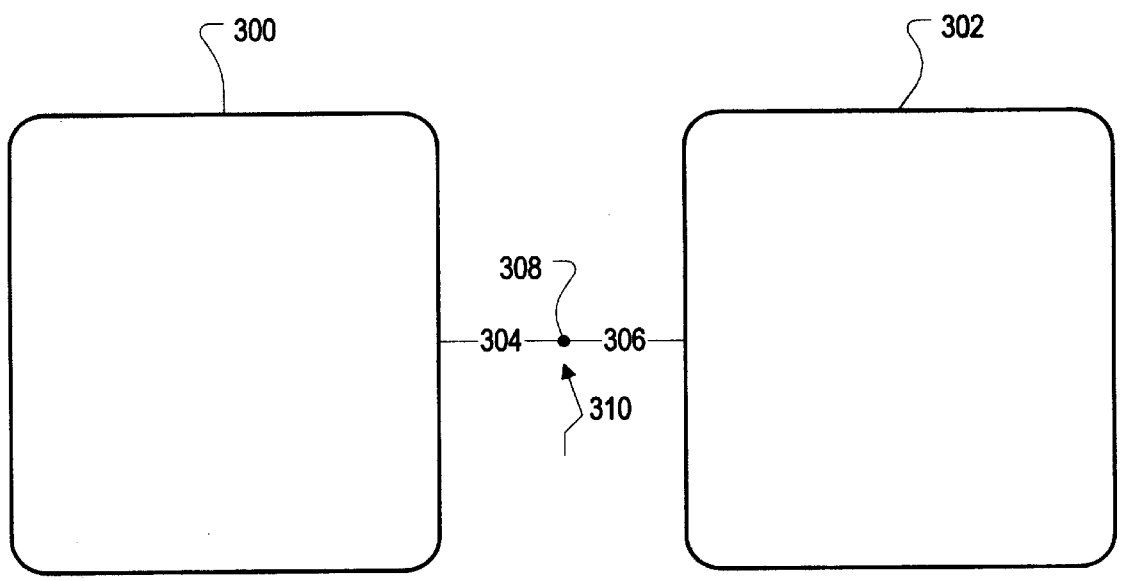
FIGS. 3(a) through 3(d) illustrate the problems of various topological constraints that are resolved by the present invention.
Figure 3B:
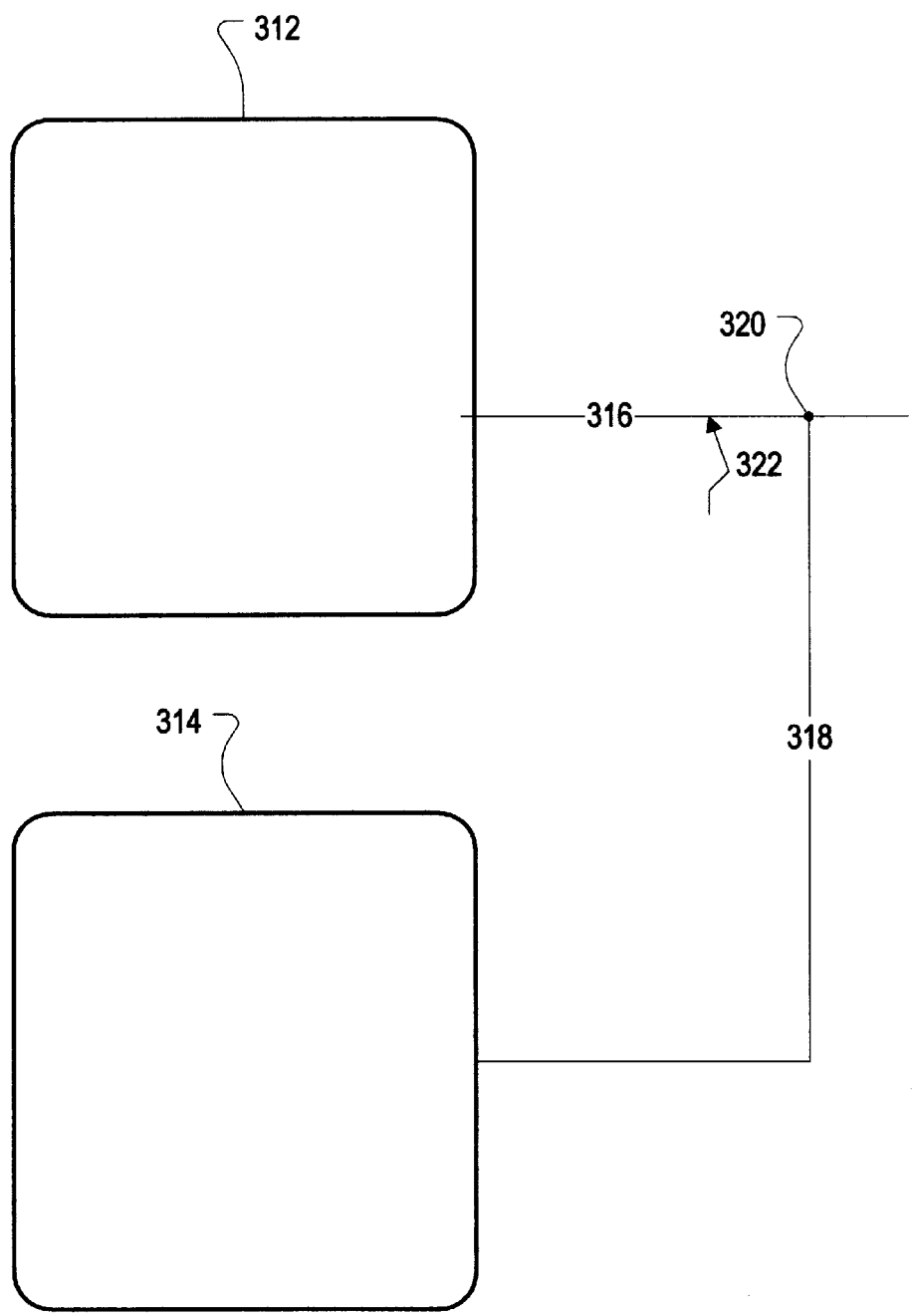
Figure 3C:
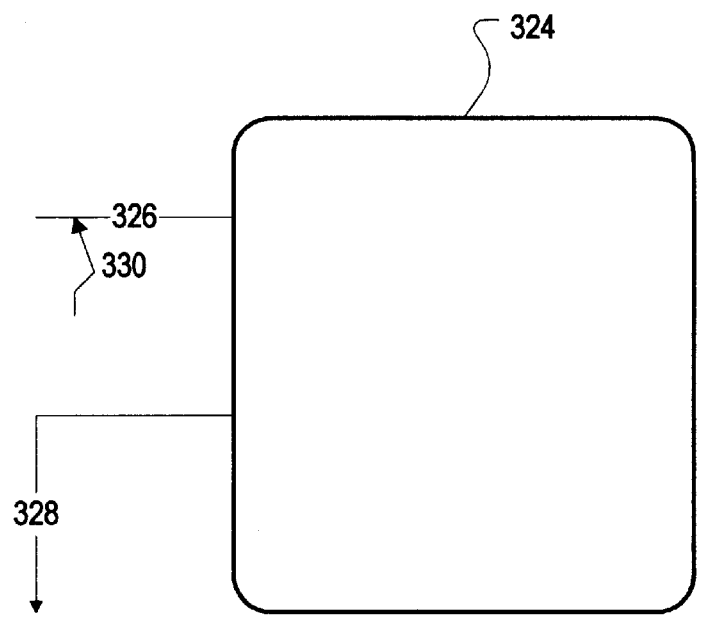
Figure 3D:
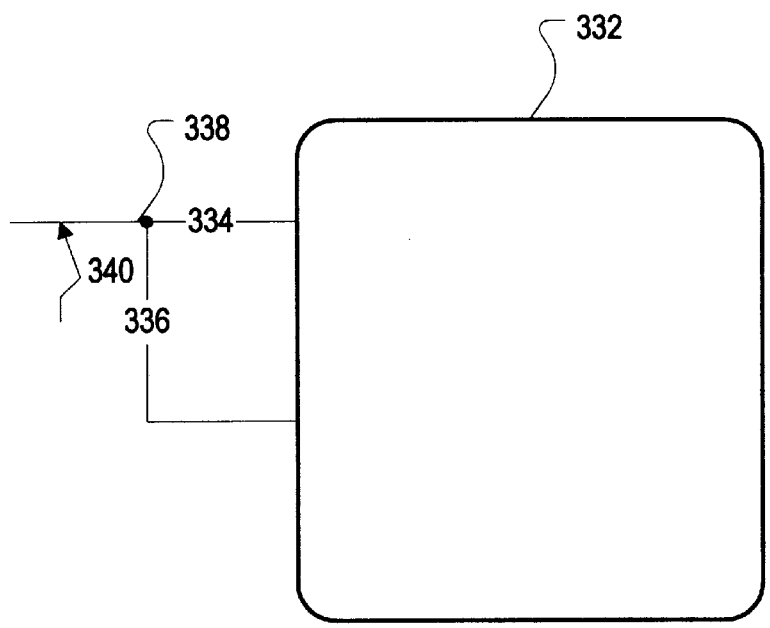

FIGS. 3(a) through 3(d) depict the various situations where automated digital libraries support accurate testing of devices. In FIG. 3(a), the output 304 on a first device 300 shares the same node 308 with the input 306 on a second device 302. Testing the second device 302 would entail stimulating 310 its input 306 at the shared node 308, thereby overdriving the competing output 304 on the first device 300. While a tester is capable of overdriving the output, it is possible that damage may occur to the first device 300 as a result of overdriving its output 304 at the shared node 308. Similarly, in FIG. 3(b), an output pin 316 on one device 312 may not be readable where it shares the same node 320 with the output pin 318 that is stimulated 322 on another device 314. FIG. 3(c) shows a device 324 with two input pins 326, 328, where one of the pins 328 is directly tied to a fixed voltage, and FIG. 3(d) shows a device 332 that has two input pins 334, 336 that are tied together and share the same node 338. As a result, a pre-defined test that might require input pins 326, 328 on device 324, and input pins 334, 336 on device 332 to be stimulated, cannot be applied to input pin 328 on device 324 and input pin 336 on device 332 because those pins are not free to be stimulated 330, 340 as the pre-defined test assumed. In all of these examples, either pins need to be disabled or conditioned to test the target device or the test must be customized to account for the conditions. These problems can be resolved by the present invention, since automated digital library development can accurately and comprehensively record this information during device synthesis and make such information available for an IPG. As a result, the IPG can generate tests using more accurate information.

Figure 4:
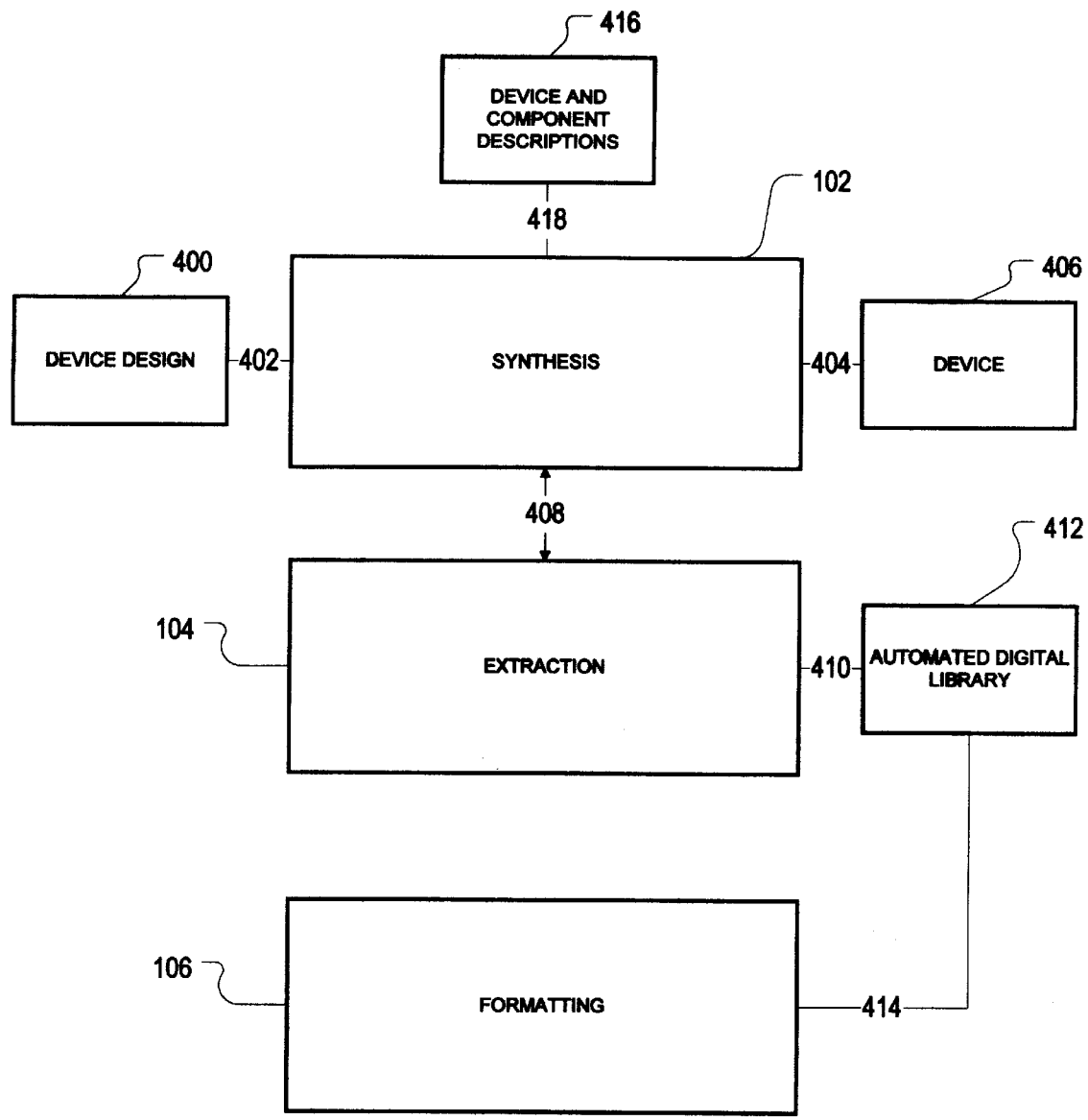
FIG. 4 illustrates the stages of automated digital library development.

As illustrated in FIG. 4, automated digital library development is a three-stage process comprising synthesis 102, extraction 104, and, optionally, formatting 106. In the synthesis stage 102, a device design 400 that is typically described in a High Level Design Language is read 402, and a device 406 performing in accordance with the device design 400 is synthesized from device and component descriptions 416. During this stage, automated digital library development draws from the database 416 in accordance with the device design 400 and synthesized device 406, and generates an automated digital library 412 for use in in-circuit testing. In generating the automated digital library 412, user-defined information such as tied pin constraints, additional pin disable methods, and additional pin conditioning methods may be noted. Testability disciplines can also be added to the device design during this stage. As synthesis synthesizes device logic, extraction 104 records 410 elements of an automated digital library 412 by extracting 408 device and component descriptions from the database and noting information about the components and pins of the device. An automated digital library can include the following elements (i.e. description and tests):

Device pin information: each pin is labeled and identified as being an input, output, bidirectional, power, ground, no-connect, or analog pin. This information is used to determine the nature of the pins that are later connected to board nodes.

Family information: this identifies for the individual pins of the device the family the pins belong to. For example, a device may be a 5-volt low-power Schottky TTL device, or a 3-volt CMOS device. This is needed to prepare a tester for driving and receiving the correct voltage/current levels.

Disable information: explains how given output drivers (on simple or bidirectional pins) are disabled. For example, if a device has bidirectional data bus pins, these may be disabled by holding an output-enable input pin low. The disable section of a digital library contains syntax for expressing this simple relationship. Other outputs may require that a sequence of patterns be applied to several inputs in order to obtain the same effect. These are called disable methods. There may be one or more disable methods recorded for the output drivers.

Conditioning information: similar to the disable information, conditioning information explains how to achieve a certain driven state on outputs, rather than a disabled state.

Truth-table vectors, or the actual test information that can be provided for each device. If topological constraints prevent a digital library test from being applied (see FIGS. 3(a)–3(d)), an IPG will delete the unit (i.e. a collection of vectors that achieve a particular test goal for part of or the entire device) and apply an alternate test. If there is no alternate test, the unit is thrown out and some test coverage is lost. There are ways of preventing this. If board topology is known at the time these tests are written (i.e. during device synthesis), the tests can be written so that they are ideally suited to the topology. More commonly, however, board topology is not known when the device is synthesized. In these cases, tests should be comprehensively written to account for as many topological constraints as possible in order to maximize the number of testable units. These can then be the starting point for an IPG to modify and create tests according to other device information and board topology in order to create executable tests. The working tests can include the following sections:

Presence and orientation: a limited test that will pass if the device is present and oriented correctly on the board. It only addresses a small subset of inputs and outputs for the device.

Pin wiggle: a larger test that attempts to prove that all the pins can be wiggled, that is, sent to both 0 and 1 states, and that any stuck inputs will produce a faulty output. This test addresses all the digital input/output pins.

Logic verification: a much larger test that exercises the internal logic of the device more comprehensively. This test may also be a simple test that initiates an internal Built-In Self Test (BIST) that runs by itself and then reports a pass/fail result.

A basic library comprises device pin and pin family information. A more fully developed library can comprise additional device information, such as pin disable and pin conditioning methods as well as truth-table vectors for the device tests.

Automated digital library development can record how given output drivers (on simple or bidirectional pins) are disabled and/or conditioned during the synthesis/extraction stages. If additional disable and conditioning methods are provided, automated digital library development can record these as well. A presence and orientation test can be an objective during the synthesis stage. A pin-wiggle test can be recorded as part of the synthesis stage, but since testability features may already be added to the design during this stage for the purpose of testing the internal workings of the design, a pin wiggle test may be a natural result if this view is restricted to the I/O pins. A logic verification test is often a deliverable of synthesis stage. If user tests and methods are provided, automated digital library development can also record this information. For example, a user can describe tied pin constraints to automated digital library development and request it to develop tests with the user described constraints in place. Similarly, a user could ask for a disabling or conditioning method that makes use of a particular set of inputs, rather than let the automated digital library development pick a method and input set at random.

Automated digital library development provides a solution to the variety of problems encountered by incomplete and inaccurate digital library tests, as illustrated by the various examples of topological constraints in FIGS. 3(a) through 3(d). In FIG. 3(a), a truth-table test that requires input 306 to be stimulated on the device 302 will result in overdriving a competing output 304 on the other device 300 because of the shared node 308. Since device information is automated, automated digital library development can accurately and efficiently generate a variety of tests to cover this scenario. Automated digital library development can also provide conditioning information to an IPG which can use these to create executable tests that puts these outputs into high impedance states, or that conditions the outputs at risk to a "0" or "1" if any of these states minimizes overdrive stress. Similarly, if an input cannot be stimulated because it is tied to a fixed voltage as in FIG. 3(c), or because it is tied to another input pin as in FIG. 3(d), automated digital library development can generate tests and/or provide supplemental information that an IPG can use to generate accurate executable tests.

In the formatting stage 106, the automated digital library is formatted 414 into an appropriate syntax for the in-circuit tester being used. In a preferred embodiment, the automated digital library is formatted in HP's 3070 Vector Control Language (VCL), which is used by HP's 3070®. The VCL language is full-featured and contains a variant language called Pattern Capture Format (PCF) which can be used to express simpler "truth table" form test vectors. The overall form that encompasses the elements of an automated digital library in a preferred embodiment is shown below. For purposes of illustration, the following conventions are used:

lowercase boldface words are reserved identifiers the symbol "::=" should be read as "is defined as"

a vertical bar "|" separates alternative syntaxes items enclosed by square brackets ("[]") may be omitted or included once items enclosed by braces ("{}") may be omitted or included one or more times statements following an exclamation ("!")are comments.

<Library>::=

<logic type statement>

[<global family statement>]

<pin assignment statement list>

<pin identification statement list>

[<local family statement list>]

[<timing specification>]

[<pcf order statement list>]

[<static disable statement list>]

[<vector unit blocks>]

The last three items are optional if the library being generated contains no test vectors. This happens if a "setup" library has been requested that is only intended to identify pins, pin types and family information, or if test vectors were not generated for some technical reason in the library generator.

Logic Type Statement

The <logic type statement> is used to identify whether the device tested is combinatorial or sequential in nature. This is used by other software that modifies sets of test vectors.

<logic type statement>::=combinational|sequential

A combinational device does not contain memory whereas a sequential device does. Thus a test for a combinational device may be reordered or have vectors deleted without causing the test to fail. A sequential device must have every vector in a test vector unit retained and executed in the specified order for it to work correctly.

Note that a device may contain memory and be "sequential" but the test might only exercise a combinatorial function accessible from I/O pins. Thus the test could be typed as "combinational" since vector order would not be essential to proper operation.

Global Family Statement

The optional <global family statement> is used to identify the "family" that a device's I/O pins belong to. This information is used by other software that needs to produce physically working tests where (for example) logic 1/0 states have been converted into voltage levels. Family information is usually given in terms of industry-recognized names such as "TTL" or "CMOS", but can be any identifier that will later be used to look up family information tagged with that name.

<global family statement>::=<family identifier>
<family identifier>::=<identifier>
Example:
    family CMOS For many devices, all I/O pins are of the same family, so a <global family statement> is used to identify the family in a single statement. However some devices may have multiple I/O pin families. The <local family statement list> may be used to identify all pin family information, which eliminates the need for an (optional) <global family statement>. All I/O pins must ultimately, either globally or locally, have a family specification.

Pin Assignment Statement List

The <pin assignment statement list> is used to assign identifiers to IC pins.

<pin assignment statement list>::={<pin assignment statement>}
        <pin assignment statement>::=assign <pin identifier> to pins <pin spec>
        <pin identifier>::=<identifier>
        <pin spec>::=<integer>|<quoted identifier>
Examples:

| | |
|---|---|
| assign Addr_00 to pins 2 | ! Numerically identified pins |
| assign Addr_01 to pins 5 | |
| assign Vcc to pins 12 | |
| assign Reset to pins "A14" | ! Grid array pins |
| assign Mclk to pins "J07" | |

All subsequent references to device pins are performed using <pin identifier> names in a VCL/PCF description. The full VCL/PCF language allows multiple pins to be assigned to a single <pin identifier>, but a single pin per identifier can also be produced. This one-to-one mapping makes subsequent mappings easier to maintain. Multiple assignments of <pin identifier> to a given pin are allowed, so one could have one set of one-to-one assignments and another assignment that groups many pins together.

Pin Identification Statement List

The <pin identification statement list> is used to identify the nature of each pin as input, output, bidirectional or power. If none of these categories apply, then "nondigital" is used.

<pin identification statement list>::={<pin identification statement>}
        <pin identification statement>::=<pin type><pin identifier list>
        <pin type>::=inputs|outputs|bidirectional|power|nondigital
        <pin identifier list>::=<pin identifier>{, <pin identifier>}
        <pin identifier>::=<identifier>
Examples:
    inputs MCLK, RESET, INT_1, INT_2
    outputs ADDR_00, ADDR_01, ADDR_02, ADDR_03
    outputs ADDR_04, ADDR_05, ADDR_06, ADDR_07
    bidirectional DATA_0, DATA_1, DATA_2, DATA_3
    power VCC_1, VCC_2, GND_1, GND_2, and VREF
    nondigital NC_1, NC_2

Pins are typed as input, output, bidirectional, power or "nondigital". The nondigital type is reserved for pins that may be analog, unconnected ("no connects") or otherwise not a member of the other types.

Note that "power" pins include all positive, negative and ground pins delivering power (wattage) or fixed reference voltages. Descriptive <pin identifier> names like "VCC", "GND" or "VDD_1" are desirable.

Local Family Statement List

The optional <local family state list> is used to identify family information for any pin. This can be used to override a global family specification when some pins are not the same family type as the majority, or, they can be used to specify all pin family information, eliminating the need for a global statement. In any case, all I/O pins must have a family specification.

<local family statement list>::={<local family statement>}
        <local family statement>::=family <family identifier> on <pin identifier list>
Example:
    family CMOS on MCLK, RESET

Timing Specification

The <timing specification> is used to give guidelines on how fast a test should be executed.

<timing specification>
        <vector cycle statement>
        <receive delay statement>
        <vector cycle statement>::=vector cycle <time spec>
        <receive delay statement>::=receive delay <time spec>
        <time spec>::=<integer><multiplier>
        <multiplier>::=u|n The <time spec> is an integer immediately followed (no space) with an optional multiplier character that indicates microseconds (µ) or nanoseconds (n). For instance, 250 nanoseconds is "250n".
Examples:
  vector cycle 350n
  receive delay 250n

PCF Order Statement List

The <pcf order statement list> is used to define the order that vector data in vectors is assigned to pins.
  <pcf order statement list>::={<pcf order statement>}
    <pcf order statement>::=pcf order <optional default modifier>
    <pcf order name>is<pin identifier list>
    <optional default modifier>::=null default
    (a null entry in a list of options indicates that an empty field may be a legal choice for this element.)
    <pcf order name>::=<identifier>
Examples:
  pcf order default Parallel is TCK, TMS, TDI, TDO, RESET, ADDR_0
  pcf order default Parallel is ADDR_1, ADDR_2, ADDR_3
  pcf order Scan is TCK, TMS, TDI, TDO
This example illustrates several things:
Pcf order definitions are cumulative. In this example, the order named "Parallel" has 9 pins assigned to it.
Pcf order "Parallel" is the "default" order used when an order is not specified in a vector description.
Pcf order "Scan" defines a subset of the "Parallel" order.
Pcf orders are enumerated left-to-right, such that TCK would be the first (leftmost) character in a vector, etc.

Static Disable Statement List

A Static Disable Statement identifies one or more output drivers (for either output or bidirectional pins) that can be combinatorially disabled by a static pattern applied to one or more input pins.
  <Static Disable Statement List>::={<Static Disable Statement>}
    <Static Disable Statement>::=disable <driver list> with <input list> to <pattern vector>
    <driver list>::=<pin identifier list>
    <input list>::=<pin identifier list>
A <driver list> identifies pins typed either as output or bidirectional that are to be disabled. An <input list> identifies pins typed as input that are to be conditioned to achieve the disabling of the identified outputs. The number of pin in <input list> must correspond to the number of states enumerated in <pattern vector>.
Example:
  disable B1, B2 with En to "0"

Vector Unit Blocks

Vector Unit Blocks come in two forms, the <disable method unit> and the <test unit>. Subsections of this section will describe each. Units are part of the PCF subset of the VCL language only. They offer a "truth table" style of vector expression.
  <vector unit blocks>::=
  <disable method unit list>
  <test unit list>
While either component of <vector unit blocks> is optional, it is expected that at least one component will be non-empty.

Disable Method Unit Lists

Disable Method Units are collections of vectors that will achieve a disabling objective for some set of output or bidirectional drivers.

```
<disable method unit list>::={<disable method unit>}
    ● <disable method unit>::=
        unit disable method <unit label>
        <disable statement list>
        pcf
        <vector block list>
        end pcf
        end unit
    ● <unit label>::=<string>
    ● <disable statement list>::=
        <disable statement>
        {<disable statement>}
        ● <disable statement>::=<simple disable statement>|
        <disable with statement>
            ● <simple disable statement>::=disable <pin
              identifier list>
            ●<disable with statement>::=disable <pin
              identifier list1>with <pin identifier list 2>[<hold
              clause>]
                ● <pin identifier list 1>::=<pin identifier list>
                ● <pin identifier list 2>::=<pin identifier list>
                ● <hold clause>::=hold <pattern vector>
    ● <vector block list>::={<vector block>}
        ● <vector block>::=
                [<use pcf order statement>]
                <vector list>
        ● <use pcf order statement>::=use pcf order <pcf
          order name>
        ● <vector list>::={<pattern vector>}
```

Note that the number of pattern bits in a <pattern vector> within a <hold clause> must equal the number of signals in its associated <pin identifier list 2> element.

Note that the number of pattern bits in a <pattern vector> within a <vector list> must equal the number of signals referenced by the <use pcf order statement> element. If the <use pcf order statement> element is missing, t he default pcf order is assumed to be in effect.

Conditioning methods are a superset of disable methods and can also be defined in this section.

Test Unit Lists

A test unit list is a sequentially executed list of test units. Test units contain vectors of apply/receive data for some set of device pins. If the logic type of a device is combinational, then subsequent software assumes that individual vectors within a unit can be deleted without harming the action of vectors that come after the deleted vectors. If the logic type of a device is sequential then individual vectors cannot be deleted because that would cause subsequent vectors to (potentially) fail because they depend on state information within the device itself. It is assumed for sequential devices that each unit is self contained and that units can be executed in any order. Thus, for a sequential device, if any vector needs to be removed, there is no choice but to delete the entire unit or at least all vectors that follow the deleted vector.
  <test unit list>::={<test unit>}
    <test unit>::=
      unit <unit label>
      pcf
      {<vector block list>}
      end pcf
      end unit FIG. 5 illustrates a sample fully featured 3070 library test. This library defines a device that is sequential. Most library tests will be sequential because most devices to be tested are sequential. However, if a device has combinational test facilities, the test could be rated combinational even if the device is not. The default family for the pins 502 is defined in the library, but may be changed later. If the pin lists for the pin family 512 or pin type 506 become long, the statement may be repeated on subsequent lines to complete the lists. Each pin (or pin-grid array in this example) is assigned to identifiers that are used in later syntax 504. In 508, the timing for vector application is set, as is the timing to strobe receivers after a cycle begins. Two PCF orders are defined here 510 which define the order in which signals in a pattern vector will be applied to the pins. The default order is "Parallel" and the second is "Scan". Note that "Scan" is a subset of "Parallel". Again, if the order list becomes too long, lines can be repeated. The disable method 512 specifies that TDO will be disabled by this method 512(*a*), and that TMS is to be held low after the unit completes 512(*b*). Other signals disabled by this unit 512(*c*), 512(*d*) are listed as well. The vector description is started 512(*e*) and the context is set 512(*f*). The signal states for the "Parallel" ordering are described 512(*g*), and then "Scan" order is started 512(*h*) where only four signals are described. The pattern vector 512(*i*) defines that TCK=1, TMS=1, TDI off, ignore TDO; and the pattern vector 512(*j*) defines that TCK=0, TMS=1, TDI off, ignore TDO. The PCF description ends 512(*k*) and then the unit ends 512(*l*). A unit test is defined in 514 where a switch is made to PCF 514(*a*), and an order in use is declared 514(*b*). Vectors are defined in 514(*c*) and 514(*d*). The PCF description ends 514(*e*), and then the unit ends 514(*f*).

Figure 6:
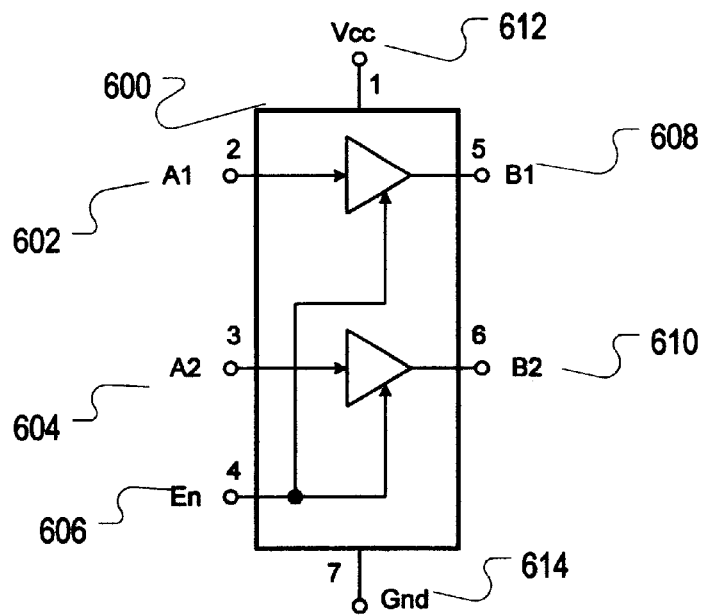
FIG. 6 illustrates a combinational device.

FIG. 6 illustrates a combinational circuit 600 comprising two inputs 602, 604, two 3-state buffers 608, 610 with a common enable input 606, and two power pins 612, 614, and FIG. 7 illustrates a sample 3070 library test for this device. The library specifies that the test is combinational 700 and that the device's I/O pins belong to the TTL family 702. Additionally, each pin (1, 2, 3, 4, 5, 6, 7) is assigned an identifier (Vcc, A1, A2, En, B1, B2, Gnd) that is used throughout the library code 704, and the nature of each pin is identified as input, output, or power, for example 706. The timing is assigned 708, and a static disable is defined 712 which needs no vectors like a unit disable method. The PCF order 710 defines the order in which the signals in a pattern vector are applied. Therefore, the pattern vector "0Z1LX" for PCF order "All" will be applied to the pins in the order defined for "All", so that A1=0, A2 is off, En=1, B1 is an output low state, and B2 is ignored. The tests for the two buffers 714, 716 are written in separate units so that they may be tested independently, allowing downstream test editing software to discard one or the other independently if there are board level constraints that will not allow one to be executed.

Figure 8:
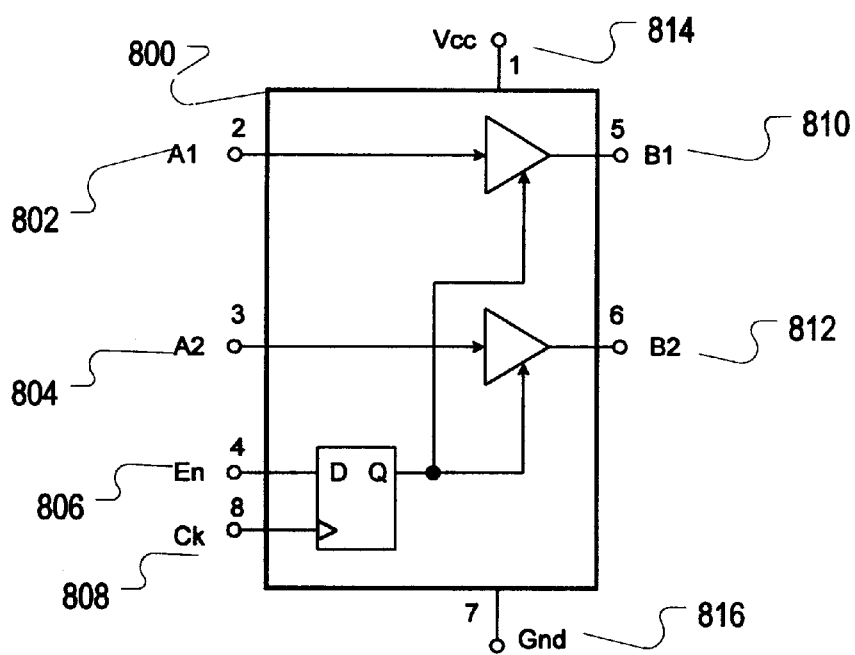
FIG. 8 illustrates a sequential device.

FIG. 8 illustrates a sequential device 800 comprising two inputs 802, 804, two 3-state buffers 810, 812 with a common enable input 806, a clock input 808, and two power pins 814, 816, and FIG. 9 is a sample 3070 library test for this sequential device. This example is almost identical to that illustrated in FIGS. 6 and 7, except that it requires a sequence of patterns to disable drivers rather than a static disable. In this example, the library test specifies that the test is to be sequential 900, the pin family is defined as "TTL", one group name per pin is assigned 904, pin types are assigned 906, and the timing is assigned 908. One PCF order for all pins is assigned with two statements in order to reduce line length 910. A multi-vector disable unit 912 is utilized, where Ck is held to 0 after the method completes. En is free for other uses. Note that Ck=0 is usually easier to "hold". The first pattern vector 912(*a*) sets En and Ck to low, the second pattern vector 912(*b*) puts a positive edge on Ck to disable outputs, and the third pattern vector 912(*c*) sets Ck to 0. Unit "Test 1" 914 tests the top buffer. All signals exist in PCF order but only those pins needed have driven or received data. All other pins are set to Z (input not being driven) or X (don't care value). Unit "Test 2" 916 tests the lower buffer. Again, all signals exist in PCF order and only those pins needed have driven or received data, and all others are Z or X. While each unit may be executed sequentially, it is safer to make each unit self-initializing.

Figure 10:
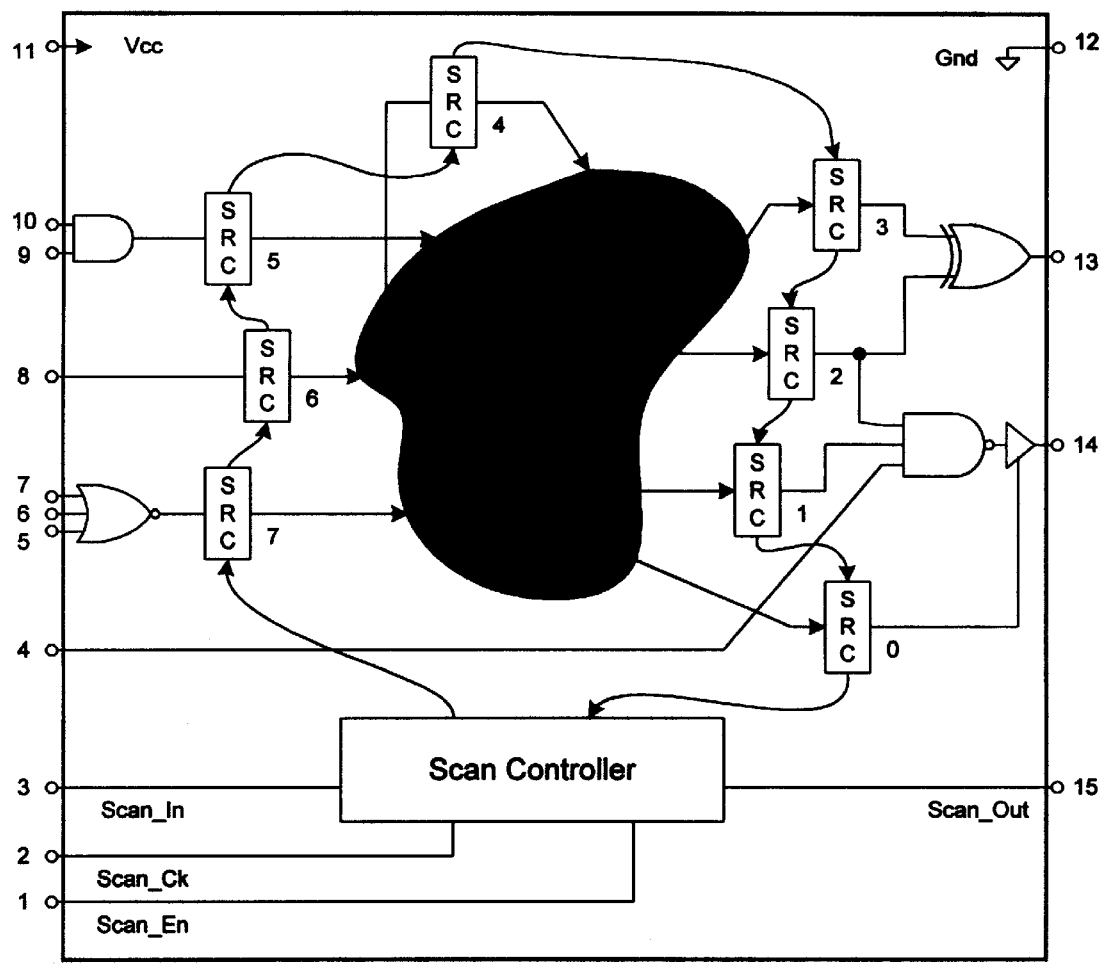
FIG. 10 illustrates a device containing a hypothetical internal scan testability structure.

FIG. 10 illustrates a device containing a hypothetical internal scan testability structure. This allows a great deal of control and observability in general. However, there are ways of utilizing this testability that are optimized for in-circuit test library production and ultimate utilization. A scanned device test library will be typed sequential. To get events to happen, data will be shifted in and/or out of a potentially lengthy scan chain. Combined with this is the probability that later in-circuit test analysis will have to delete certain tests due to topology and/or access limitations. This means that test units need to be written to be self-initializing and oriented towards the conflicting goals of being short (and not too numerous) as well as having a good probability of surviving deletion by later conflict analysis. A simple and non-optimal approach would be simply to consider each I/O pin of the device, one by one. A scan test could be built for each (for now, ignore the complication of logic ones) such that the unit reads (or writes) a 1 and 0 from/to the pin. Thus, 2*n scans would be needed, each potentially containing tens of thousands of shift cycles as determined by scan chain length. This would yield a voluminous test wasteful of resources (disc, analysis and compile time). Here are some techniques to create much shorter tests by virtue of eliminating test units by combining functionality of many into few. These techniques take advantage of foresight into how in-circuit tests are analyzed with respect to surrounding topology:

1. Treat all bidirectional pins as outputs only and describe them as such. The In-circuit tester will effectively test the IC connections to a board, but allow in-circuit analysis (see item 2 next) to retain test units in the face of limited access.
2. Write a pair of test units for all outputs (and bidirectionals acting as outputs) together. These units could place an alternating pattern of 0s and 1s on the outputs, followed by a second unit applying a pattern of 1s and 0s. If access is missing from some outputs, in-circuit test analysis would simply ignore those pins but retain the test unit itself. (If for some reason a bidirectional pin had been connected to a fixed voltage such that one unit might conflict with this voltage, that unit would then be discarded but the other would remain.)
3. Treat each remaining input (the number of these may be small due to item 1 above) by itself. This amounts to writing a unit for each input that sets the input to 1 and later to 0, capturing and observing this value in the scan register. Since the vast majority of the register cells will not capture meaningful data, these will contain "X" data. This means that most shift register shifting will be simple clocking, composed of two vectors (one per edge) that can be placed in a "repeat loop" to save vector space and greatly shorten the files.

Figure 11:
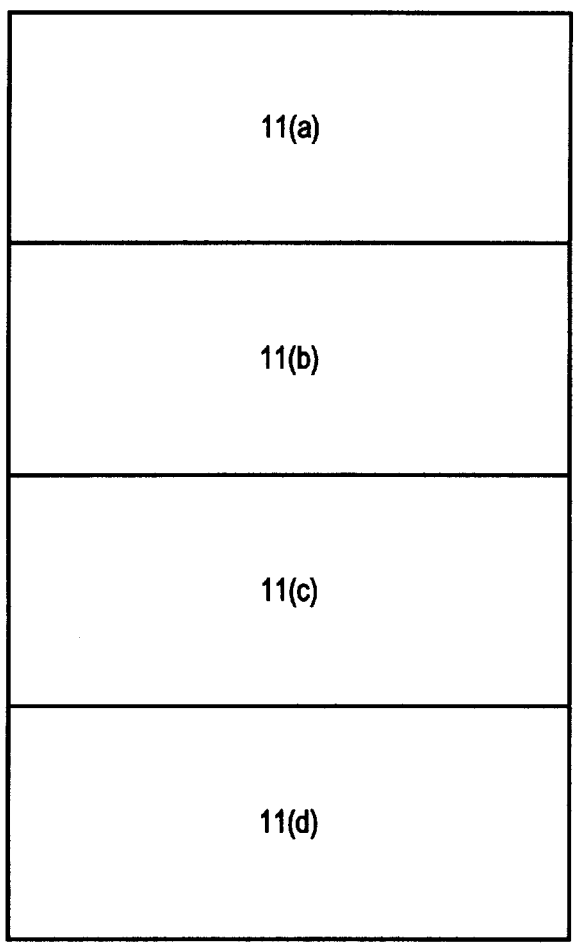
FIG. 11, comprising subparts 11(a) through 11(d), illustrates a sample library test optimized for the device of FIG. 10.

FIGS. 11(*a*) through 11(*d*) illustrate a sample library test that is optimized for this circuit. In FIG. 11(*a*), the library specifies that the test is to be sequential 1100, the pin family is defined as "CMOS" 1102, each pin is assigned one group name (non-scan I/O pins are assigned arbitrary names) 1104, pin types are assigned 1106, and timing is assigned 1108. One PCF order is assigned for all pins, and is assigned with four statements to reduce line length 1110(a). A second PCF order is defined for the scan port only, which is also the default PCF order 1110(b). Unit disable method "Disable 1" 1112 is a sequential multi-vector disable method that uses Scan_En and Scan_Ck. Scan_Ck is held to 0 after the method completes 1112(a). Scan_En is free for other uses, and En is set to high and Ck is set to low to get ready for shifting 1112(b). A positive edge on Ck shifts a "0" bit from Scan_In 1112(c). In 1112(d), the next seven bits are don't cares and a repeat loop is used to shorten the expression. The P14 driver is disabled in 1112(e) because there is a 0 in SRC 0, and Scan_Ck is set to low.

In FIG. 11(b), unit "Test Outputs 01" 1114 tests outputs with a 0–1 alternating bit pattern. Setting SRC's (shift register cells) 0, 2, and 3 are sufficient to create the output pattern and avoids using input pin p4 1114(a), but P4 must be enabled for driving 1114(b). The rest of the SRC's are don't-cares 1114(c). Upon completion of this test, there should be a "01" on P13 and P14 1114(d). Unit "Test Outputs 10" 1116 tests for "10" on P13 and P14 so it is similar to the previous unit. Note that input pin P4 is stimulated by this unit. P4 is set to "1" and stays at "1" during scanning 1116(a). SRC's 0–3 need specific data 1116(b), and SRC's 4–7 are don't cares 1116(c). Note that P4 must be "1" 1116(d). Upon completion of this test, check for a "10" at P13 and P14 1116(e).

In FIG. 11(c), unit "Test Input P4 " 1118 tests pin P4 . Input P4 can only be seen at output P14 if SRC's 1 and 2 are both 1 and the output driver is enabled by SRC 0 1118(a). SRC's 0, 1, and 2 are loaded 1118(b), and SRC's 3–7 are don't cares 1118(c). Input P4 is visible at P14 1118(d) and the opposite state is then tested 1118(e).

In FIG. 11(d), unit "Test Input P5 " 1120tests pin P5 . Input P5 can be seen at SRC 7 only if P6 and P7 are held low, so P5 , P6 , and P7 are conditioned 1120(a) and the SRC's are clocked 1120(b). In 1120(c), the SRC's are shifted out. SRC's 0–6 are don't-cares 1120(d), and SRC 7 should contain a "1" 1120(e). P5 is set to "1" and the path to SRC 7 is sensitized and captured 1120(f). The SRC's are shifted out again 1120(g). SRC's 0–6 are don't-cares 1120(h), and SRC 7 should contain a "1" 1120(i). Input pin tests for pins 6, 7, 8, 9, and 10 are nearly identical to the unit test for input pin 5, and are skipped in this library test 1122.

Although in-circuit tests for the apparatus of FIGS. 6, 8, and 10 may be developed manually through the expenditure of considerable time and money, automated digital library development can accomplish the same result during device synthesis in a timely and cost-effective manner.

While illustrative and presently preferred embodiments of the invention have been described in detail herein, it is to be understood that the inventive concepts may be otherwise variously embodied and employed, and that the appended claims are intended to be construed to include such variations, except as limited by prior art.

What is claimed is:

1. An apparatus for generating an automated digital library for in-circuit testing at the board level, comprising:
   a. one or more computer readable storage mediums;
   b. computer readable program code stored in the one or more computer readable storage mediums, the computer readable program code comprising:
      i. program code for accessing a database of device and component descriptions and synthesizing a device which performs in conformance with a device design; and
      ii. program code for accessing said database and extracting device and component descriptions for generating an automated digital library for in-circuit test of the synthesized device at the board level.

2. An apparatus as in claim 1, additionally comprising program code for formatting said automated digital library into an appropriate syntax for an in-circuit tester to read.

3. An apparatus as in claim 1, wherein said automated digital library comprises:
   a. device pin information; and
   b. pin family information.

4. An apparatus as in claim 3, wherein said automated digital library comprises:
   a. pin disable methods;
   b. pin conditioning methods.

5. An apparatus as in claim 1, wherein said automated digital library comprises truth-table vectors to determine the presence and orientation of device pins.

6. An apparatus as in claim 1, wherein said automated digital library comprises truth-table vectors to wiggle I/O pins on the device.

7. An apparatus as in claim 1, wherein said automated digital library comprises truth-table vectors to verify the internal logic of the device.

8. An apparatus as in claim 1, wherein said device design is written in a High Level Design Language.

9. An apparatus as in claim 1, wherein:
   a. said program code for accessing said database and synthesizing a device synthesizes a device in conformance with tied pin constraints read from said device design; and
   b. said program code for accessing said database and extracting device and component descriptions for generating an automated digital library generates an automated digital library in conformance with tied pin constraints read from said synthesized device.

10. An apparatus as in claim 1, wherein:
   a. said program code for accessing said database and synthesizing a device synthesizes a device in conformance with pin disabling methods read from said device design; and
   b. said program code for accessing said database and extracting device and component descriptions for generating an automated digital library generates an automated digital library in conformance with pin disabling methods read from said synthesized device.

11. An apparatus as in claim 1, where in:
   a. said program code for accessing said database and synthesizing a device synthesizes a device in conformance with pin conditioning methods read from said device design; and
   b. said program code for accessing said database and extracting device and component descriptions for generating an automated digital library generates an automated digital library in conformance with pin conditioning methods read from said synthesized device.

12. An apparatus as in claim 1, wherein an automated digital library is generated for each device on a printed circuit board.

13. A computer implemented method of generating an automated digital library for in-circuit testing at the board level, comprising:
   a. providing a database of device and component descriptions;
   b. synthesizing a device from said database of device and component descriptions, said device being synthesized to perform in conformance with a device design; and
   c. accessing said database to extract device and component descriptions for generating an automated digital library for in-circuit test of said synthesized device at the board level.

14. A method as in claim 13, additionally comprising formatting the automated digital library into an appropriate syntax for an in-circuit tester to read .

15. A method as in claim 13, wherein said device synthesis and said automated digital library generation are performed substantially in parallel.

16. A method as in claim 13, wherein said device comprises I/O pins, and tests of said automated digital library are defined in terms of said I/O pins.

17. A method as in claim 13, wherein said automated digital library comprises:

a. device pin information; and b. pin family information.

18. A method as in claim 17, wherein said automated digital library additionally comprises:

a. pin disable methods; and b. pin conditioning methods.

19. A method as in claim 13, wherein said automated digital library comprises truth-table vectors to determine the presence and orientation of device pins.

20. A method as in claim 13, wherein said automated digital library comprises truth-table vectors to wiggle I/O pins on the device.

21. A method as in claim 13, wherein said automated digital library comprises truth-table vectors to verify the internal logic of the device.

* * * * *